(12) United States Patent
Godlieb et al.

(10) Patent No.: US 10,775,949 B2
(45) Date of Patent: Sep. 15, 2020

(54) CAPACITIVE TOUCHSCREEN MIRROR DEVICE AND METHOD OF MANUFACTURING

(71) Applicant: KONINKLIJKE PHILIPS N.V., Eindhoven (NL)

(72) Inventors: Robert Godlieb, Drachten (NL); Jeroen Christian Nijdam, Eelderwolde (NL)

(73) Assignee: KONINKLIJKE N.V., Eindhoven (NL)

( * ) Notice: Subject to any disclaimer, the term of this patent is extended or adjusted under 35 U.S.C. 154(b) by 0 days.

(21) Appl. No.: 16/334,397

(22) PCT Filed: Sep. 15, 2017

(86) PCT No.: PCT/EP2017/073255
§ 371 (c)(1),
(2) Date: Mar. 19, 2019

(87) PCT Pub. No.: WO2018/054768
PCT Pub. Date: Mar. 29, 2018

(65) Prior Publication Data
US 2019/0220116 A1    Jul. 18, 2019

(30) Foreign Application Priority Data

Sep. 21, 2016  (EP) ..................... 16189853

(51) Int. Cl.
*G06F 3/044*  (2006.01)
*G06F 3/042*  (2006.01)
(Continued)

(52) U.S. Cl.
CPC ........... *G06F 3/044* (2013.01); *G02B 5/0808* (2013.01); *G06F 3/0421* (2013.01);
(Continued)

(58) Field of Classification Search
None
See application file for complete search history.

(56) References Cited

U.S. PATENT DOCUMENTS 5,878,353 A    3/1999  Ul Azam
8,835,789 B2   9/2014  Mischel, Jr.
(Continued)

FOREIGN PATENT DOCUMENTS

DE    102012105713 A1    1/2014
EP        3056978 A1    8/2016
JP        2015095183 A  5/2015

*Primary Examiner* — Patrick N Edouard
*Assistant Examiner* — Peijie Shen

(57) ABSTRACT

Touchscreen mirror device (100) comprising a touchscreen panel (10) and a mirror surface (20). The touchscreen panel (10) comprises a grid of capacitive sensors (12) for detecting a position of an input object such as a fingertip (F) near the touchscreen panel (10). The mirror surface (20) is configured to at least partially reflect a mirror image (M) at a front side of the mirror surface (20). The mirror surface (20) comprises a reflective metal layer (21) divided in separate metal islands (21a, 21b) that are electrically isolated from each other by a single contiguous gap (G) for allowing the capacitive sensor (12) to detect a position of the input object through the mirror surface (20).

15 Claims, 5 Drawing Sheets

(51) Int. Cl.
*G02B 5/08* (2006.01)
*H03K 17/96* (2006.01)

(52) U.S. Cl.
CPC . *H03K 17/9622* (2013.01); *H03K 2017/9602* (2013.01); *H03K 2217/96077* (2013.01)

(56) References Cited

U.S. PATENT DOCUMENTS

| | | | |
|---|---|---|---|
| 2002/0196333 A1* | 12/2002 | Gorischek | A45D 44/005 348/61 |
| 2009/0243824 A1 | 10/2009 | Peterson | |
| 2010/0117988 A1* | 5/2010 | Jacobs | G06F 3/045 345/175 |
| 2011/0102325 A1 | 5/2011 | Sato | |
| 2011/0291959 A1* | 12/2011 | Wu | G06F 3/0412 345/173 |
| 2012/0043914 A1* | 2/2012 | Mischel, Jr. | H03K 17/78 315/362 |
| 2012/0187821 A1 | 7/2012 | Lee | |
| 2017/0273181 A1* | 9/2017 | Sohn | G06F 3/041 |
| 2018/0032227 A1* | 2/2018 | Broxson | G06F 1/1605 |

* cited by examiner

CAPACITIVE TOUCHSCREEN MIRROR DEVICE AND METHOD OF MANUFACTURING

This application is the U.S. National Phase application under 35 U.S.C. § 371 of International Application No. PCT/EP2017/073255, filed on Sep. 15, 2017, which claims the benefit of International Application No. 16189853.1, filed Sep. 21, 2016. These applications are hereby incorporated by reference herein.

FIELD OF THE INVENTION

The present invention relates to mirrors having an integrated touchscreen panel, in particular a capacitive touchscreen panel. The present invention further relates to a method of manufacturing such a capacitive touchscreen mirror device.

BACKGROUND OF THE INVENTION

Within the domain of personal care, e.g. shaving and grooming, so-called "magic mirrors" form a relatively new concept. With such magic mirrors, for example, information is displayed behind or on a mirror surface to enhance the standard mirror experience. In a particular implementation the magic mirror may use a camera image to display a mirror-image on a screen overlaid with enhancements. However, it is difficult to replicate the mirror experience, e.g. depth, using a computer screen. In another implementation the magic mirror uses a display screen behind a two-way (semi-transparent) mirror. In this implementation, for example, the mirror transmits an illuminated display image from a back side of the mirror surface through the mirror surface to a front side thereof while reflecting a mirror image of the user at its front side.

To add further functionality to the mirror device, it is desired to provide the convenience of a touch input interface on the mirror surface. For this purpose existing mirror devices, for example, comprise touch technology, such as optical, resistive or conductive pads or pressure-sensitive pads. However, these touch technologies are relatively intrusive and not so easy to operate. Accordingly, it is preferred to use a capacitive touchscreen which is generally more responsive and used also in other display devices such as smartphones and tablets.

One method to create a conventional mirror surface is to use a metallic reflective layer. For example, a thin, deposited layer of aluminum or silver on a transparent substrate can be used as the mirroring plane. However, these metallic layers are also electrically conductive and therefore considered unsuitable in combination with capacitive sensors arranged behind the mirror surface. In particular, the presence of such a conductive layer may negate the function of the capacitive sensors.

The prior art U.S. Pat. No. 8,835,789 B2 describes apparatuses and methods for using a capacitive touch controller with a conductive surface. The known apparatus comprises a mirror having a reflective layer that is conductive and reflects light. A trench is formed in the reflective layer to define a touch area of the reflective layer that is isolated from the rest of the reflective layer. A conductive pickup is mounted on a back side of the mirror over the touch area and the conductive pickup is electrically connected to a capacitive touch controller, such that when a user touches the touch area on a front side of the mirror the touch controller responds to the touch. It is noted in the prior art that the known apparatus may suffer from cross-talk when multiple touch areas are intended. The prior art discloses to minimize the cross-talk between touch pads by increasing the trench widths. The prior art also discloses providing a source of backlight to make the trenches visible on a front side of the surface. However this may detract from a visual appeal of the mirror surface and only allow static touch controls.

Accordingly, there remains a desire to improve apparatuses and methods using a capacitive touch controller in combination with a conductive mirror surface.

SUMMARY OF THE INVENTION

One aspect of the present invention provides a touchscreen mirror device comprising a capacitive touchscreen panel. The panel comprises a grid of capacitive sensors suitable for capacitively detecting a presence or position of a conductive and/or capacitive input object, such as a fingertip, at or near the touchscreen panel. A mirror surface covers the touchscreen panel at a front side thereof facing a front side of the mirror device, i.e. the side facing a user of the mirror device. The mirror surface is configured to at least partially reflect a mirror image of the user at the front side of the mirror surface. The mirror surface comprises a reflective metal layer divided across the mirror surface in separate metal islands that are electrically isolated from each other. Capacitive sensors at different sensor positions may be associated with their respective nearest metal islands, typically the island having the strongest capacitive coupling with the sensor at that position. Advantageously, for a pair of neighboring island, at least one pair of neighboring capacitive sensors is provided wherein each of one of said pair of sensors is associated with a respective one of the pair of neighboring metal islands. In particular, said neighboring metal islands are electrically isolated from each other by a single contiguous non-conducting gap without metal or other conductive layer there between. In other words, the metal islands and corresponding sensors are arranged such that there are no unassociated metal islands separating islands associated with a neighboring pair of sensors.

By electrically isolating said metal islands, i.e. separate layer portions or partitions of the metal layer, the capacitive sensor is enabled to detect the presence or position of the input object, for example a fingertip, through the mirror surface. Without being bound by theory, it is noted that the partitioning of the metal layer may alleviate the problem of electrical charges and fields dissipating or spreading through the entire metal layer. Accordingly, local charges and fields may be induced e.g. by capacitive coupling between the capacitive sensor and a fingertip with less dissipation in the metal layer. This may improve sensitivity and/or accuracy (resolution) of the capacitive sensor. Advantageously, a metal layer generally has a good reflection quality for a broad range of wavelengths of light and for a broad range of angles of optical incidence. Furthermore, the metal layer is easy to manufacture for any desired transparency, e.g. by appropriate selection of the layer thickness and/or the type of metal.

As described herein, the associated (nearest) metal islands to a pair of neighboring sensors are themselves neighboring metal islands with one contiguous non-conducting gap without metal layer there between. The expression "neighboring" as used herein refers to the nearest neighbor. For example, "neighboring metal islands" are islands directly adjacent to each other without any other island there between. Similarly, "neighboring sensors" are sensors that are right next to each other in a positional sequence of the sensor grid without any other sensor there between. Providing instances wherein pairs of neighboring metal islands have associated pairs of capacitive sensors, may allow registering single touch events across multiple sensors, i.e. registering the touch event over an extended area of different sensor positions. For example, it may occur that a finger touches and/or capacitively couples with two (or more) neighboring metal islands and this touch is registered by at least two different sensors, each providing a measure for the capacitive coupling. The registration of a touch event over multiple sensors may enable more accurate measurement of the position where the touch event is taking place, e.g. by smoothing and/or interpolation of multiple measurement values. By improving accuracy, closely spaced touch events maybe distinguished and enable a touch display with flexible and dynamic controls. This may be contrasted with the prior art where static controls are provided by metal islands with associated neighboring sensors which islands are separated by intermediate conducting structures without associated sensor. Such intermediate conducting structures prevent cross-talk between the islands which cross-talk may in fact be beneficial to the positional accuracy of a sensor grid. Accordingly, an improved capacitive touch screen mirror device is obtained.

The relative density of metal islands and sensors may vary depending on a desired resolution and appearance of the mirror device. For example, in a low density of metal islands, multiple sensors may be associated per metal island, i.e. measure the capacitive coupling there between. In this case, when two neighboring metal islands are touched, this may be registered by two sets of multiple sensors wherein at least one sensor in the first set (associated with the first islands) is a neighbor to another sensor in the other set (associated with the neighboring second island). Alternatively, by having metal-islands that are smaller than the sensor-areas, the alignment or direct-allocation may be less critical in impact on sensitivity. For example multiple metal islands may be associated per sensor. Also in this case, at least some pairs of neighboring metal islands may be associated with (capacitively coupled to) a respective pair of neighboring sensors. Alternatively still, of course the islands may also be distributed with the same resolution as the sensor grid, i.e. wherein each metal island is associated with one (nearest) sensor to which it couples the most. In this case all neighboring metal islands are associated with neighboring sensors and vice versa.

Advantageously, the touchscreen panel may register a simultaneous coupling between the input object (e.g. finger) and two, three, or more neighboring metal islands across the contiguous non-conducting gap by measuring a relative capacitive coupling between the respective two or more neighboring metal islands and their respective associated capacitive sensors at the respective sensor positions. Parameters such as a maximum dimension of the metal islands in a direction parallel to the mirror surface, the non-conducting gap between the metal islands, and a distance of the metal islands to their associated capacitive sensors may be configured to allow transmission of a first capacitive coupling between a finger and a plurality of the metal islands via a second capacitive coupling between the plurality of the metal islands and their associated capacitive sensors.

In addition, because the typical voltage differences which may be expected between the separate metal islands for capacitive sensing are relatively low (in the order of millivolts or less), the separation distance between the separate metal islands of the metal layer can be relatively small while still providing sufficient electrical isolation. For example, the separation distance or gap between the separate metal islands is preferably in a range between 10 and 200 micrometers, more preferably between 30 and 100 micrometers, e.g. 50 micrometers. Advantageously, this may allow a capacitive coupling across the gap, between islands and/or between a one finger and multiple islands. In addition, said separation distance or gap can be so small that the separation lines between the separate metal islands become virtually invisible in the mirror image during normal use. For example, at twenty-five centimeters distance from the mirror surface it was found to be difficult for a normal user to distinguish separation lines thinner than 0.1-0.3 millimeters.

Sufficient coupling between the sensors and their associated islands may typically be achieved when the distance there between is relatively small, e.g. between fifty micrometers and five millimeters, preferably between hundred micrometers and three millimeters. When a grid of capacitive sensors is covered by an area filled with metal islands, it is preferred that all metal islands in the area are separated by a single contiguous non-conducting gap, e.g. a grid of mutually connected lines. For example there are no intermediate conducting rings around (sensor associated) islands which would prevent cross-talk.

In some embodiments, the touchscreen panel may be configured to provide a positional mapping of variable amounts of capacitive coupling as a function of position across the grid of sensor positions. While accuracy of the sensor grid may be optimal when the separate metal islands have dimensions that are comparable to or smaller than a separation between sensor positions, this is not strictly necessary. For example, the positional mapping is calculated by interpolating and/or smoothing the variable amounts of capacitive coupling measured across the grid of sensor positions. The positional mapping may provide a resolution that is more accurate than a center-to-center distance between neighboring metal islands. Accordingly, the mirror device may accurately calculate a position of the input object based on the positional mapping.

In some cases, positional accuracy may be further improved by (re)calibrating the sensor array once the metal islands have been applied on top. For example, a calibration circuit may be provided to correct for any offset between a calculated position of the input object and an actual position. Further improvement of the accuracy may be achieved by aligning the metal islands with the underlying capacitive sensors, e.g. having the gaps between the islands directly above gaps between the associated sensors there below.

To further reduce the visibility of the separation lines present between the separate metal island of the reflective metal layer, it can be advantageous to arrange an extended grid of the separation lines according to an irregular pattern, e.g. a (semi) randomized pattern. It is noted that the human eye typically has more difficulty distinguishing an irregular pattern than a regular or periodic pattern. For example, instead of a standard periodic grid of lines, such as a square or rectangular grid of lines, the separation lines are preferably arranged in a pattern wherein the separation lines extend in multiple, e.g. three or more, different directions. Alternatively, or in addition, the separation lines have straight portions or line segments in the pattern with a limited maximum length, e.g. of five millimeters or less. Alternatively, or in addition, curved separation lines can be used. These and other features may be combined in semi-random or non-periodic patterns to provide minimum visibility of the separation lines in the mirror image.

The mirror device may comprise an optional display for providing an (illuminated) display image which is at least partially overlaid with the capacitive sensor. For example the capacitive sensor can be disposed between a display and a semi-transparent (two-way) mirror, wherein the display image is projected through the mirror surface. It will be appreciated that the combination of a display, mirror, and touchscreen panel can provide synergetic advantages and applications. Advantageously, the display can be integrated in the touchscreen panel. Alternatively, or in addition, a display image may also be projected from a front side of the mirror device, e.g. by an external display source. Alternatively, or in addition, a (static) graphic representation may be provided on or behind the mirror surface, e.g. indicating a touch control input field or area. Advantageously, the combination of a display with the presently enabled positional measurement may allow flexible and/or dynamic controls.

Mass-manufactured capacitive touchscreen panels are typically intended for human-finger operation. Hence they are designed to sense a human finger-sized object and determine the presence or touch position for a finger. For example, the position is resolved to the size of the display element, i.e. the position is expressed in screen pixel coordinates for the display-touch-panel assembly. It is noted that the capacitive sensor may determine locations with a finer resolution than the capacitive sensing areas themselves, e.g. by interpolating the "weight" of sensing of a finger by adjacent capacitive sensing areas.

The inventors have found that, when the proposed separate metal islands or partitions of the reflective metal layer are equal to or smaller than the capacitive sensing areas, there is minimal or no loss of sensing capability. In practice, for human-finger operation, this implies that the separate metal islands are preferably equal to or smaller than a human fingertip to have no loss or degradation of function for the touchscreen panel. Therefore, in an embodiment, the separate metal islands or partitions have a maximum dimension, seen in a direction parallel to the mirror surface, of twelve millimeters or less, e.g. one centimeter. Such a maximum dimension of the separate metal islands enables a reliable detection of the position of a human fingertip on the mirror surface. Alternatively, when the capacitive sensor comprises a capacitive sensor grid, said maximum dimension may also be related to a resolution of the capacitive sensing elements of the capacitive sensor grid. E.g. the separate metal islands may have a maximum dimension twice as large as the resolution of the capacitive sensor grid, preferably a maximum dimension equal to or less than the resolution of the capacitive sensor grid. For example, the capacitive sensor grid may have a resolution of less than one centimeter. On the other hand, the separate metal islands of the reflective metal layer are preferably large enough to provide a sufficiently large total reflective surface area of the mirror surface, e.g. compared to the total surface area of the separation lines. Accordingly, the separate metal islands preferably have a minimum dimension, seen in a direction parallel to the mirror surface, of at least one millimetre, e.g. more than half a centimeter. For example, a typical surface area of the separate metal island or partition can be about twelve by twelve millimeters.

To create sufficient mirror-like appearance, it was found that the metal layer of the mirror surface preferably has a reflectivity of at least forty, and preferably at least fifty percent (i.e. for perpendicularly incident light in the visible wavelength range). Also other ranges are possible, e.g. a touch mirror device may have up to hundred percent reflectivity and very little or no transmission. For example, the display device can be omitted. At the same time, the reflectivity of the metal layer can also affect the amount of transmitted light coming from the display arranged behind the mirror surface. Accordingly, it is preferable that the reflectivity of the metal layer of the mirror surface does not exceed eighty percent, e.g. has a value between fifty and seventy percent, to avoid excessive losses of the display light transmitted through the mirror surface. For example, the metal layer may have a layer thickness between 0.1 and 50 micrometers, preferably between 1 and 10 micrometers.

The mirror surface can be provided on an optically transparent substrate, i.e. with a partitioned metal layer comprising separate metal island provided on the substrate. For example a glass or PMMA substrate can be provided with an aluminum or silver coating that is divided or partitioned into separated metal islands. The combination of a glass substrate and an aluminum layer is preferred in view of an improved transparency and relatively low costs. Furthermore, this combination may also provide an improved optical mirror performance, e.g. with respect to fidelity of the image with a low degree of distortions and defects (in other words, a high modulation transfer function). The substrate can be separately produced and mounted on an existing touchscreen panel display. Alternatively, the metal layer may be directly applied to the front side of the touchscreen panel display. Preferably, a transparent protective layer is applied on an outer surface of the device to protect the metal layer from damage. The protective layer can also be formed by the substrate on which the metal layer is applied, e.g. by arranging the metal layer between the (glass) substrate and the touchscreen panel. The touchscreen panel may also have its own protective (non-conductive) layer.

The capacitive sensors may e.g. comprise a grid or circuit of capacitive sensors. More in particular, for example conductive lines can be used to detect a change of capacity resulting from positioning of a conductive and/or capacitive object such as a finger in proximity to the lines. A general purpose or dedicated touch processor can be used to receive touch input from the sensor and calculate the position of the fingertip, e.g. according to a coordinate on the surface of the mirror and/or relative to a projected image of the display.

The touchscreen panel and display can be integrated or separate device layers. A separate or integrated display controller can be used to control the appearance of the displayed image. For example, the display may comprise a plurality of pixels that are controlled to form the image. The image is preferably illuminated to make it visible through the metal layer of the mirror surface in front of the mirror device. For example, the display comprises a backlighted liquid crystal display (LCD) or organic light emitting devices (OLEDs). It is noted that the area of the display and/or touchscreen panel can be a sub-area of the total front surface of the mirror device, e.g. if it is unnecessary to provide the displayed image across the entire front surface of the mirror device. For example, an area of the mirror surface can be more than two times larger than an area of the touchscreen panel. In this way, a relatively small and inexpensive touchscreen panel can be combined with a relatively large mirror surface.

Another or further aspect of the present disclosure provides a method of manufacturing a touchscreen mirror device. According to the method, during manufacturing a touchscreen panel is provided and covered, at a front side thereof facing a front side of the mirror device, with a mirror surface as described herein. The mirror surface can be manufactured, for example, by providing a thin metal layer on a transparent substrate and by providing gap lines in the metal layer, e.g. produced by etching or another lithographic technique. To mass produce the partitioned metal layer is can be advantageous to use a mask pattern in the etching process. Alternatively, or in addition, gap lines can be produced using a moving laser beam ablating a line pattern across the metal surface layer.

BRIEF DESCRIPTION OF THE DRAWINGS

These and other features, aspects, and advantages of the touchscreen mirror device and the method of manufacturing thereof according to the present invention will become better understood from the following description, appended claims, and accompanying drawing, wherein:

DETAILED DESCRIPTION OF THE EMBODIMENTS

Figure 1:
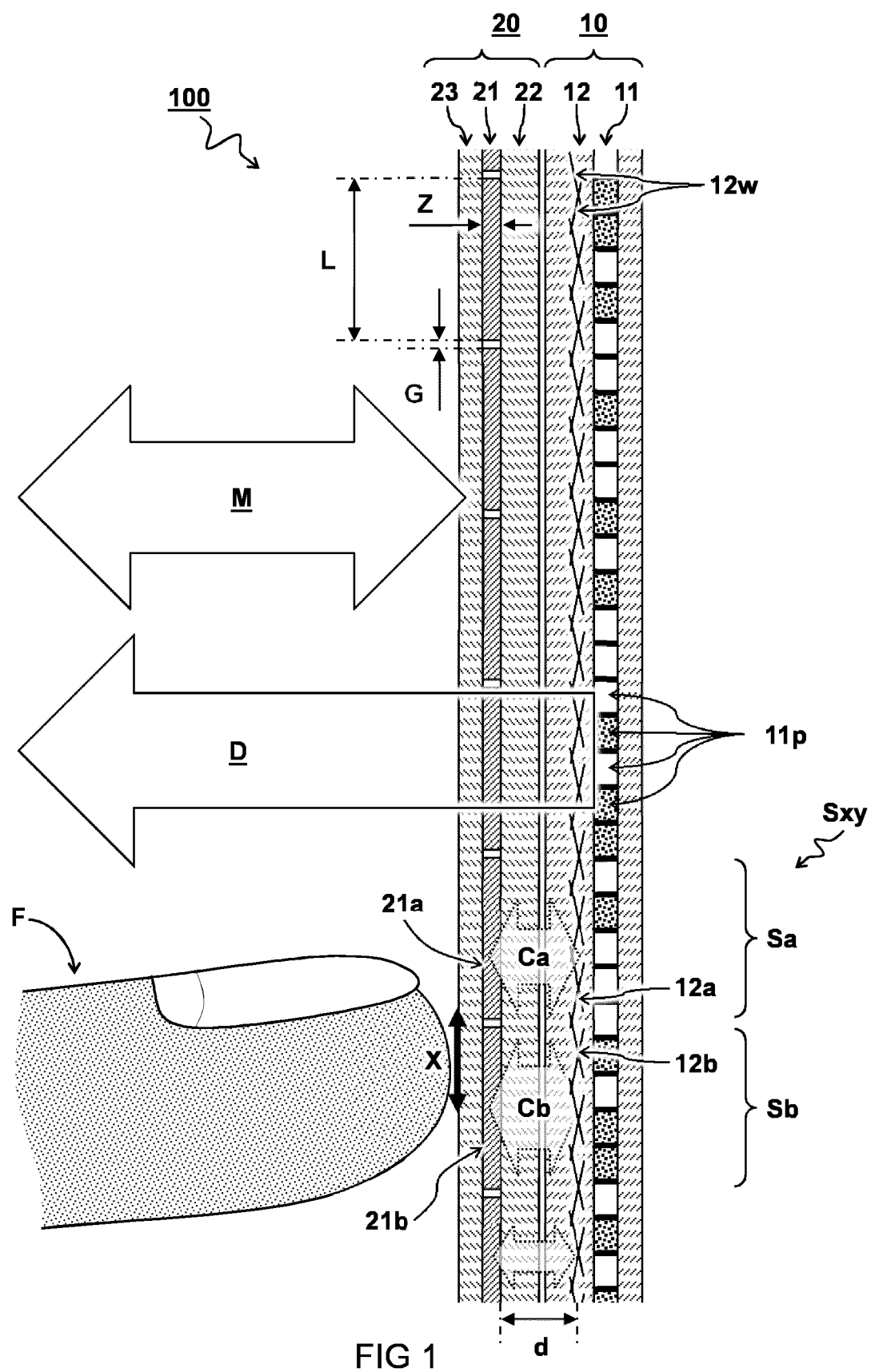
FIG. 1 schematically illustrates a cross-section view of a part of a touchscreen mirror device according to the invention.

The present invention relates to a mirror device that provides additional user-interface functionality. In particular, a method to combine a metallic mirror surface with capacitive touchscreen functionality is described. The mirror device comprises a conventional thin metallic layer, for example of aluminum or silver, to provide the mirroring function. The mirror device further comprises a touchscreen to provide user-interface functionality. The touchscreen may have additional display functionality as is known in the art.

Generally, touchscreen displays can include a capacitive sensor grid that determines the presence or the location of an object such as a finger proximate to the sensor grid. Signals sensed by the capacitive sensor grid may change with the presence and location of a fingertip relative to the sensor grid. For example, the capacitive sensor grid may comprise a matrix of rows and columns of electrodes that detect changes in capacitive coupling caused by the presence of a nearby object, typically within one centimeter distance. For example a surface coordinate of the fingertip position on the mirror can be determined by analysing electrical signals of the sensor grid. It will be appreciated that, without additional measures, in this arrangement the capacitive touchscreen would not work, because the metallic layer would prevent the capacitive sensors of the touchscreen from sensing the presence of a finger at the opposite side of the metallic layer.

The present invention enables the use of a conventional low-cost capacitive touchscreen arranged behind the metallic mirroring layer of the mirror device. For this purpose, the invention proposes to subdivide the electrically conductive metallic mirroring layer of the mirror surface into separate metal islands that are electrically isolated relative to each other. In this manner the metallic layer no longer acts as an electric shield preventing the capacitive sensors of the touchscreen from sensing a finger or other object in front of the mirror surface. It thus no longer diffuses and distributes the capacitive change over the whole touchscreen panel.

For optimal functioning of the metallic mirror layer with a touch screen comprising an array of capacitive sensor elements, it is preferred that the isolated islands are mutually separated by one single contiguous grid of non-conductive areas (e.g. lines), i.e. the non-conductive areas surrounding the isolated islands should be interconnected. This may allow so-called cross-talk between adjacent isolated islands, such that the presence of an object does not only capacitively influence the sensor element closest to the object but also the neighboring sensor elements. This cross-talk may cause the capacitive impact of an approaching object on the underlying sensor array to be most similar to the impact occurring when the mirror layer would not be present. This may allow the sensor array to measure a distribution of capacitive distortions over the adjacent sensor elements caused by the object, from which the position of the object can be determined, by means of known interpolation techniques, with a resolution which is substantially higher than the resolution of the sensor array.

Furthermore, the separate metal islands of the metallic layer preferably have sizes that are at most equal to the size of the input object, i.e. of a finger top that touches the mirror device. A practical size of the separate metal islands ranges from a few square millimeters to no larger than 12 by 12 $mm^2$. In practice the center-to-center distribution of the sensing elements may be in a similar range, e.g. in the 6 to 12 mm distribution range. Because the voltage differences between adjacent metal islands are only in the order of millivolts or less, the spatial separation or gap between the metal islands of the mirror surface can be small, e.g. 0.05 mm. Such a small gap does not affect the perception of the mirror image by the user.

Preferably, the underlying capacitive touch-panel is of the projective-capacitive type. This is the most commonly used type for touch-screens in consumer devices. These panels have an array of capacitive sensing lines or pads, to sense at a distance the capacitive distortion over a distance per line. These are generally transparent (indium-tin-oxyde, ITO) and glued to the substrate glass of the display panel. The array can consist consists of driving and sensing lines or direct sensing-lines, the presence of a finger impacts the effect of the driving line on the sensing line or is sensed as changing the value of a two-element capacitor. That impact is then measured. A map of the measured distortions of the array of lines, in two orthogonal directions, is then made. Treating this map as a graphic two dimensional representation of the presence of fingers, graphics algorithms such as smoothing and interpolation may be performed. This way the presence of one or more than one finger can be detected with coordinates that are more detailed in resolution than the actual detecting capacitive array. The actual detecting array can be implemented in the form of stacked lines, stripes or in practice a more complicated intertwined pattern of orthogonal driving and sensing or sensing patches.

Regardless of the actual pattern and density of the touch-panel sensing elements, the array is preferably designed to sense the touch of human fingers and report the location in screen-coordinates. Thereto it may be optimized to detect approximately ten millimeter sized fingertips touch. It may report touch locations in pixel-coordinates, so for a 1280× 800 screen panel, it may report a coordinate in that range. Because of this, the isolated area size is preferably in the same order of magnitude as or smaller than the human fingers. The impact of the segmented display then is reduced to the underlying touch-panel detecting 'square fingers'. i.e. the sensing system may measure the finger touch evened out over the individual panels. In the case of square panels, this means that the finger is translated into a square patch (or set of patches). This 'finger pixelization' is illustrated for example at FIG. 2, discussed below in further detail.

Because the touch event may not always be directly over and limited to one isolated island area, the system preferably allows the transfer of a finger touch on more than one isolated islands. Also with a single island touching finger, the underlying off-the-shelf touch panel may expect the capacitive impact over a range of sensing elements, to enable the graphic representation of the gradient of capacitive distortion. To be able to be transparent then, it is desired that the cross-talk from one isolated area to the other is not hindered. The isolation gaps, i.e. 'troughs' or lines that surround an isolated area are preferably all interconnected. This illustrated for example at FIG. 3, discussed below in further detail.

To increase the transparency and reduce the noticeable impact on the touch-panel processing software inputs, the resolution of the sectioning can be increased. When the conductive mirror display is segmented in islands on the resolution of the underlying display-panel, then the impact of the 'pixelization' of the finger is effectively eliminated. This means in practice islands sized in the order of 0.1 mm. A drawback may be that the relative surface area that is needed for the isolation lines becomes larger. This reduces the overall available mirror quality.

When the actual pattern of the underlying touch-panel is known, an optimal arrangement for the isolated islands may follow the same pattern. This however requires knowledge of the actual pattern in the component and the accurate alignment of the mirror and panel. In case there is a mismatch (i.e. an island with an edge over the adjacent sensor pad, even for e.g. 0.2 mm), the 'finger-pixelization' effect mentioned earlier may have a significant negative effect on the quality of the sensing of the touch-panel.

In one implementation, to create the mirror device, a 2-way half-mirror surface is applied on top of the touch-screen panel. The low-cost available touchscreen panels are those integrated with a display panel, such as e.g. integrated with a System on a Chip (SoC) computer like a ROKchip ARM system.

The invention is described more fully hereinafter with reference to the accompanying drawings. In the description and drawings, like numbers refer to like elements throughout. Relative terms (e.g. horizontal, vertical) as well as derivatives thereof should be construed to refer to the orientation as then described or as shown in the drawing under discussion. It will be understood that when a connection between structures or components is described, this connection may be established directly or through intermediate structures or components unless specified otherwise.

FIG. 1 schematically illustrates a cross-section view of a part of a touchscreen mirror device 100. The mirror device 100 comprises a touchscreen panel 10 and a mirror surface 20 covering the touchscreen panel 10.

In one embodiment, the touchscreen panel 10 comprises capacitive sensors 12 for capacitively detecting a position "X" of an input object "F" such as a fingertip near the touchscreen panel 10. For example, the capacitive sensors 12 defining a grid of sensor positions Sxy for detecting the position "X" across a surface of the mirror device 100. Preferably, the sensor positions are individually readable/addressable In a further embodiment, the touchscreen mirror device 100 comprises an optional display 11 e.g. for controlling an illuminated display image "D" overlaying the capacitive sensor grid 12. In another or further embodiment, the capacitive sensor grid 12 comprises a grid of conductive lines 12w configured to detect a change of capacity "C" resulting from positioning of a conductive object such as a finger "F" in proximity to the conductive lines 12w. Also other types of capacitive sensors or circuits may be used. In one embodiment, the device 100 comprises a touch processor (not shown). For example, the touch processor is configured to receive touch input from the capacitive sensor grid 12 and calculating a position "X" of an object "F" in proximity to the touchscreen panel 10 through the mirror surface 20.

In one embodiment, the mirror surface 20 forms a two-way or semi-transparent mirror configured to at least partially transmit the illuminated display image "D" from a back side of the mirror surface 20 through the mirror surface 20 and to at least partially reflect a mirror image "M" at a front side of the mirror surface 20. Advantageously, the mirror surface 20 comprises a reflective metal layer 21 divided in metal islands 21a, 21b, etc. The metal islands 21a, 21b are electrically isolated from each other for allowing the capacitive sensor grid 12 to detect the position "X" of the input object, e.g. finger "F" or stylus, through the mirror surface 20.

In some embodiments, capacitive sensors 12 at different sensor positions (Sa or Sb) may be associated with their respective nearest metal island 21a, 21b, e.g. the respective metal island being sensitive to a capacitive coupling with that respective sensor. Preferably, a sensor that is associated with a metal island has a sensor (area) that is at least partially underneath the metal island when viewed at a normal angle from a front surface of the display device. Furthermore, to sufficiently register the capacitive coupling, it is preferred that a metal islands is relatively close to its associated sensor, e.g. within three millimeters distance, preferably less than one millimeter, e.g. 0.9 mm or even less, e.g. half a millimeter. It is then found advantageous that, for a at least some pairs of neighboring metal islands 21a, 21b, a respective pair of neighboring capacitive sensors 12a,12b exists. These pairs may comprise a first capacitive sensor 12a associated with a first neighboring metal island 21a and a second capacitive sensor 12b associated with a second neighboring metal island 21b. Advantageously, the neighboring metal islands 21a, 21b are electrically isolated from each other by one contiguous non-conducting gap "G" without metal layer there between. In other words, the metal layer 21 is preferably without any conducting island between first and second islands 21a,21b associated with neighboring sensor positions 12a,12b.

For example in the shown embodiment, a first metal island 21a is configured to capacitively couple (Ca) to one or more (e.g. 12a) of the capacitive sensors 12 at nearby first sensor positions Sa closest to the first metal island 21a. Furthermore, a second metal island 21b is configured to capacitively couple (Cb) to one or more of the capacitive sensors 12 at nearby second sensor positions Sb closest to the second metal island 21b. As shown, the second sensor positions Sb follow the first sensor positions Sa in a sequence of the grid of sensor positions. Furthermore, as shown, the first and second metal islands 21a,21b are directly adjacent with a single non-conducting gap there between without metal layer. For example, the metal islands of the reflective metal layer 21 are separated from each other by a gap "G" having a width between 10 and 100 micrometers. The electrical isolation can be achieved e.g. by an air gap or by an isolating material.

In one embodiment, the metal layer 21 of the mirror surface 20 is configured to reflect between 50 and 70 percent of visible light, e.g. measured at a normal or perpendicular (ninety degree) optical angle of incidence. For example, the metal layer 21 has a layer thickness Z between 0.1 and 10 micrometers. Also other thicknesses are possible to achieve the desired degree of reflection. Alternatively or in addition to the thickness of the metal layer 21, the coverage percentage can also play a role in determining the characteristics, e.g. the reflectivity, of the half-way mirror. For example, the metal layer is built by vapour deposition on a separate or integrated substrate. Also other methods may be used for building the metal layer. In the shown embodiment, the mirror surface 20 comprises a substrate 22 with a partitioned metal layer. For example, the mirror surface 20 comprises a glass substrate 22 with a partitioned aluminum layer. In one embodiment, the mirror surface 20 comprises a transparent protective layer 23 on an outer surface of the mirror device to protect the metal layer 21. An additional benefit of the protective layer may be that it prevents a finger from conductively coupling two islands. For example, with a fingertip covering two metal-islands (bridging the gap), fingers actually touching the metal may conductively couple these two islands and give these the same capacitive effect (create one bigger 'island'). When protected against this, the two covered islands may purely act on the capacitance effect of the finger, which may provide a more accurate (cleaner) signal to the sensor array.

In one embodiment, a minimum dimension L of each of the separated metal islands 21a, 21b in a direction parallel to the mirror surface 20 is at least one millimetre. In another or further embodiment, a maximum dimension L of each of the separated metal islands 21a, 21b in a direction parallel to the mirror surface 20 is at most twelve millimeters. In another or further embodiment, a maximum surface area of each of the separated metal islands 21a, 21b is at most one and a half square centimeters. In one embodiment, a maximum dimension L of each of the separated metal islands 21a, 21b is at most twice a resolution of the sensor grid 12. For example, the capacitive sensor grid 12 has a resolution of less than one centimeter.

In one embodiment, the display 11 comprises pixels 11p configured to form the display image D. In another or further embodiment, the mirror device 100 comprises a display controller configured to control the display image D, e.g. by controlling the pixels 11p. In another or further embodiment, the display 11 comprises a backlighted liquid crystal display LCD. Alternatively, the display 11 comprises organic light emitting devices OLED. Instead of pixels, also other types of displays can be used, e.g. wherein an image is formed by an illuminated shape behind the mirror. For example, the shape may have the form of an input control. Typically, behind a usual display panel there is integrated the backlight layer. For example, this can be a totally luminescent layer (OLED or other electroluminescent layer), or a layer constructed to diffuse and spread evenly a light-source that illuminates from e.g. the sides. For example, a total internal reflection layer with a controlled exit pattern in the display-facing foil.

Figure 2A:
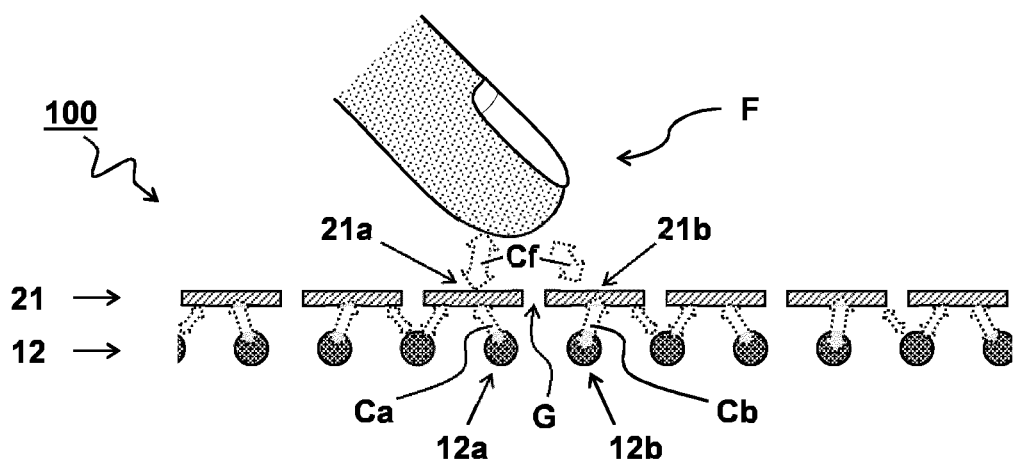
FIGS. 2A-2C schematically illustrate cross-section views wherein an input object interacts with different embodiments of a mirror device.
Figure 2B:
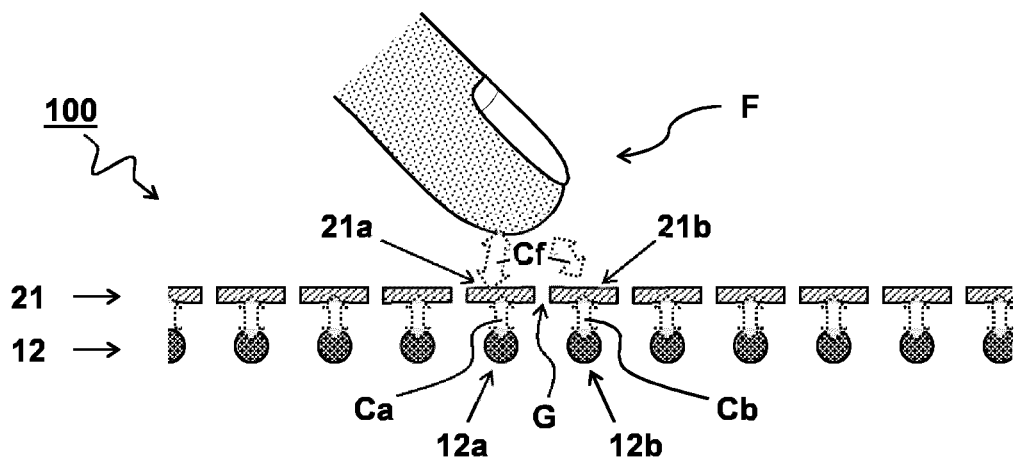
Figure 2C:
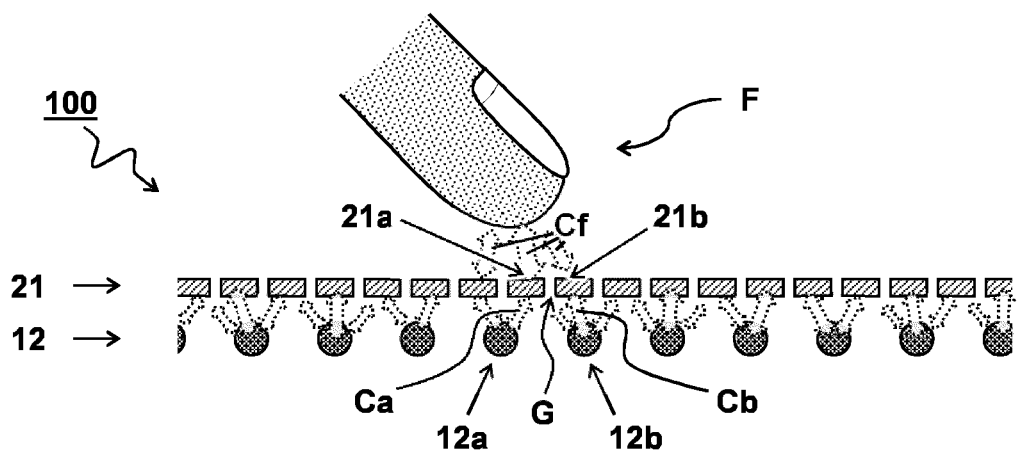

FIGS. 2A-2C schematically illustrate cross-section views wherein an input object "F", more particularly a finger interacts with different embodiments of a mirror device 100.

The embodiments differ in that they have different relative densities of the distributions of metal islands 21 and capacitive sensors 12.

FIG. 2A shows an embodiment wherein the density of metal islands 21 is larger than the density of sensors 12. Accordingly, multiple sensors may be associated with one metal island. It is illustrated how in this case, a pair of neighboring metal islands 21a,21b separated by a non-conducting gap G may be associated with a pair of neighboring sensors 12a,12b. At the edges between islands it may also occur that one sensor is associated with two islands, possibly with different coupling strength.

FIG. 2B shows an embodiment wherein the density of metal islands 21 is the same as the density of sensors 12. Accordingly, each metal island has one associated sensor. Also in this case, a pair of neighboring metal islands 21a,21b separated by a non-conducting gap G may be associated with a pair of neighboring sensors 12a,12b. There may also be further minor couplings (not shown), e.g. of one sensor with neighboring metal islands, or between metal islands.

FIG. 2B shows an embodiment wherein the density of metal islands 21 is smaller that the density of sensors 12. Accordingly, multiple islands may be associated with one sensor. Again in this case, a pair of neighboring metal islands 21a,21b separated by a non-conducting gap G may be associated with a pair of neighboring sensors 12a,12b. Also, it may occur for some islands may in between sensors may couple to multiple sensors.

Accordingly, each embodiment illustrates respective capacitive sensors 12a,12b are associated with respective nearby metal islands 21a, 21b, i.e. such that the capacitive sensors 12a,12b are configured to measure a capacitive coupling Ca,Cb with their associated metal islands 21a, 21b. Furthermore, in each embodiment, at least a subset of the metal islands comprises pairs of neighboring metal islands 21a, 21b having respective pairs of associated neighboring capacitive sensors 12a,12b. In particular, these respective pairs comprise a first capacitive sensor 12a associated with a first metal island 21a and a neighboring second capacitive sensor 12b associated with a neighboring second metal island 21b. Furthermore, the neighboring metal islands 21a, 21b are electrically isolated from each other by a contiguous non-conducting gap G without metal layer there between. It will be appreciated that in each of the embodiments it is avoided that a capacitively isolating barrier is formed by an intermediate metal island without associated sensor between metal islands associated with neighboring sensors. Such barrier may otherwise interfere with cross-talk between the islands which in this case is desired to improve positional accuracy. In other words, a touch event by a finger across neighboring metal islands can be registered by two or more sensors FIGS. 3A-3C schematically illustrate the effect of metal islands on the measured sensor signal.

Figure 3A:
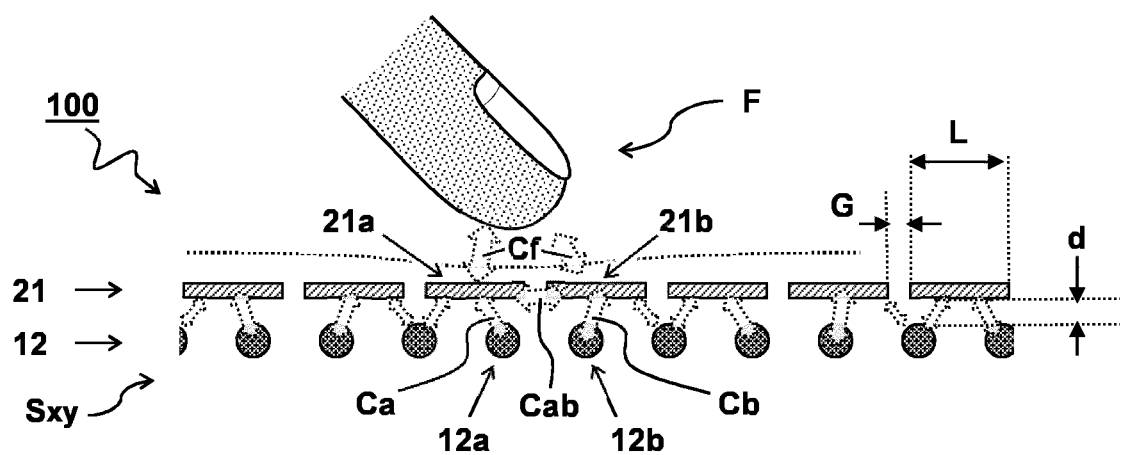
FIGS. 3A-3C schematically illustrate the effect of metal islands on the measured sensor signal.
Figure 3B:
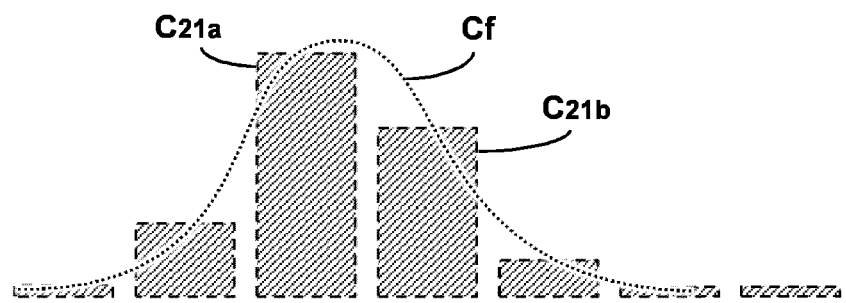
Figure 3C:
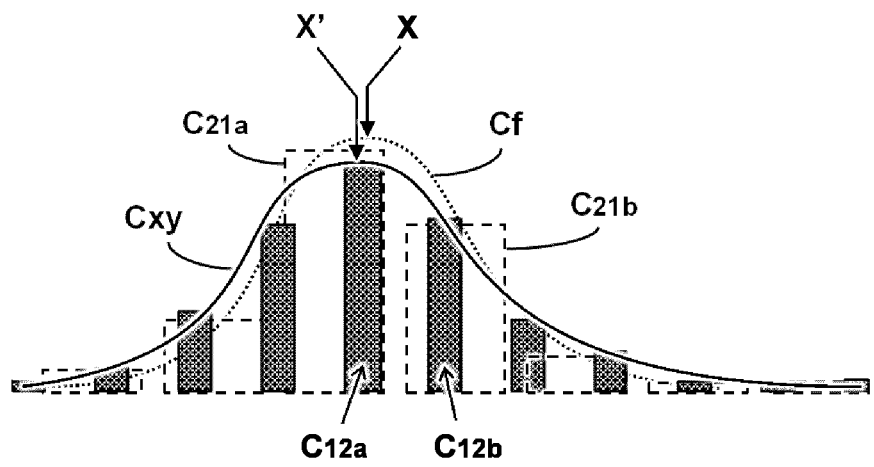

FIG. 3A schematically illustrates a cross-section view of an embodiment of the mirror device 100 with further detail. While the figure shows a mirror device similar to the embodiment of FIG. 2A, it will be understood that the following description of embodiments may equally apply to other embodiments, in particular with different densities of metal islands, e.g. according to any of FIG. 2A, 2B or 2C.

In one embodiment, e.g. as shown, the touchscreen panel is configured to register a simultaneous coupling (arrows indicated by Cf) between the input object "F" and two or more neighboring metal islands 21a,21b across the contiguous non-conducting gap "G" by measuring a relative capacitive coupling (arrows indicated by Ca and Cb) between the respective two or more neighboring metal islands 21a,21b and their respective associated capacitive sensors 12a,12b at the respective sensor positions.

In another or further embodiment, a maximum dimension "L" of the metal islands in a direction parallel to the mirror surface, the non-conducting gap "G" between the metal islands, and a distance of the metal islands to their associated capacitive sensors is configured to allow transmission of a first capacitive coupling (CO between a finger F and a plurality of the metal islands 21a, 21b via a second capacitive coupling (Ca,Cb) between the plurality of the metal islands 21a, 21b and their associated capacitive sensors 12a,12b.

Furthermore, in some embodiments, the neighboring metal islands 21a,21b are configured to have a capacitive coupling Cab across the gap "G" there between, i.e. there is cross-talk between neighboring islands with associated sensors. In one embodiment, the respective capacitive sensors 12a,12b are separated from their respective associated nearest metal islands 21a, 21b by a distance d between 0.05 and 5 millimeters, preferably between 0.1 and 3 millimeters, e.g. 0.5 millimeters. In some embodiments, the neighboring metal islands have dimensions "L" that are comparable to or smaller than a separation between the neighboring sensor positions (sensor resolution).

FIG. 3B schematically illustrates how the normal capacitive effects of a touch event (indicated by the smooth curve Cf) may result in capacitive effects C21a, C21b at the metal islands affected by a granularity or pixelization thereof.

FIG. 3C schematically illustrates how the touch event of the input object "F" may thus be registered through the metal islands 21a,21b as measurements C12a, C12b in the capacitive sensors 12. It will be appreciated that by smoothing and/or interpolation of the measurements C12a,C12b, a corresponding curve Cxy may be obtained from which a position X' can be calculated that is close to the 'actual' position X (i.e. the position that would be measured from the curve Cf without the metal islands.

Accordingly, in one embodiment, the touchscreen panel is configured to provide a positional mapping Cxy of variable amounts of capacitive coupling C12a,C12b as a function of position X,Y across the grid of sensor positions Sxy. For example, the positional mapping Cxy is calculated by interpolating and/or smoothing the variable amounts of capacitive coupling C12a,C12b measured across the grid of sensor positions Sxy. Calculations as described herein may be performed in hardware circuitry and/or software, e.g. a dedicated or general purpose controller or processor. In some embodiment, the positional mapping has a resolution that is more accurate than a center-to-center distance between neighboring metal islands 21a,21b. For example, the mirror device is configured to calculate a position X' of the input object "F" based on the positional mapping Cxy.

For improving accuracy, it may be beneficial to have the metal islands aligned with the underlying capacitive sensors 12 (not shown here). Alternatively, or in addition, some embodiments may comprise a calibration circuit (hardware and/or software) configured to calibrate an offset between a calculated position X' of the input object "F" and an actual position "X" of the input object "F", wherein the offset may be caused by a granularity and/or shifted position of the metal islands 21a, 21b with respect to the underlying grid of capacitive sensors 12.

Figure 4A:
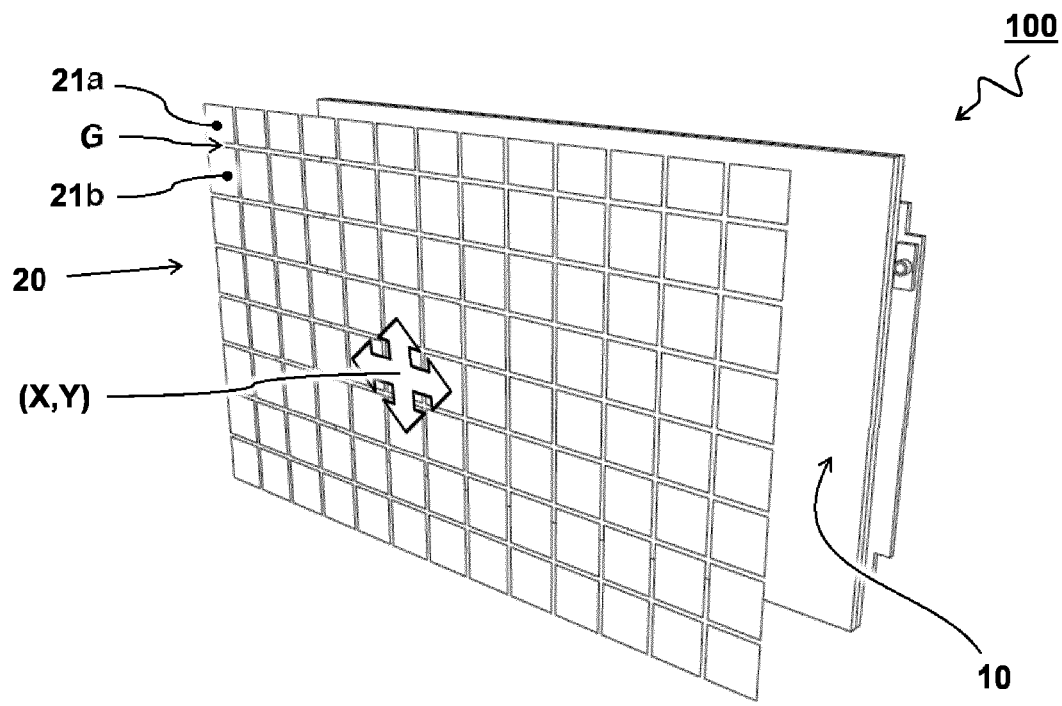
FIG. 4A schematically illustrates an exploded view of components of a touchscreen mirror device according to the invention.

FIG. 4A schematically illustrates an exploded view of components used for manufacturing an embodiment of a mirror device 100. Though the mirror surface 20 is shown in 'exploded view' at a distance from the touchscreen panel 10, for good viewing conditions the mirror surface 20 is applied as close to the display and touchscreen panel as is technically feasible or practical. As shown, the grid of capacitive sensors at the touchscreen panel 10 is covered by an area filled with metal islands (21a,21b, etc) wherein all metal islands in the area are separated by a single contiguous non-conducting gap "G", e.g. a grid of mutually connected lines.

According to one aspect, the figure illustrates a method of manufacturing wherein a touchscreen panel 10 is provided. For example, the panel 10 has a capacitive sensor grid (not shown) for capacitively detecting a position X, Y of an input object (not shown) such as a fingertip "F" near the touchscreen panel 10. The panel 10 may also have an integrated or separate controllable display (not explicitly shown here). The method may comprise covering the touchscreen panel 10 with a two-way mirror surface 20 comprising a reflective metal layer divided across the mirror surface 20 in separate metal islands 21a, 21b. The metal islands 21a, 21b are electrically isolated from each other for allowing the capacitive sensor grid 12 to detect the position X, Y of the input object through the mirror surface 20.

In one embodiment, the mirror surface 20 is formed by providing a metal layer on a substrate, and etching gap lines into the metal layer to form the separate metal islands 21a, 21b that are electrically isolated from each other. In another or further embodiment, a pattern of gap lines is etched into the metal layer 21 using a mask pattern (not shown). Alternatively, or in addition, the pattern is etched using a laser beam. Also other techniques for manufacturing a partitioned metal layer can be used.

Figure 4B:
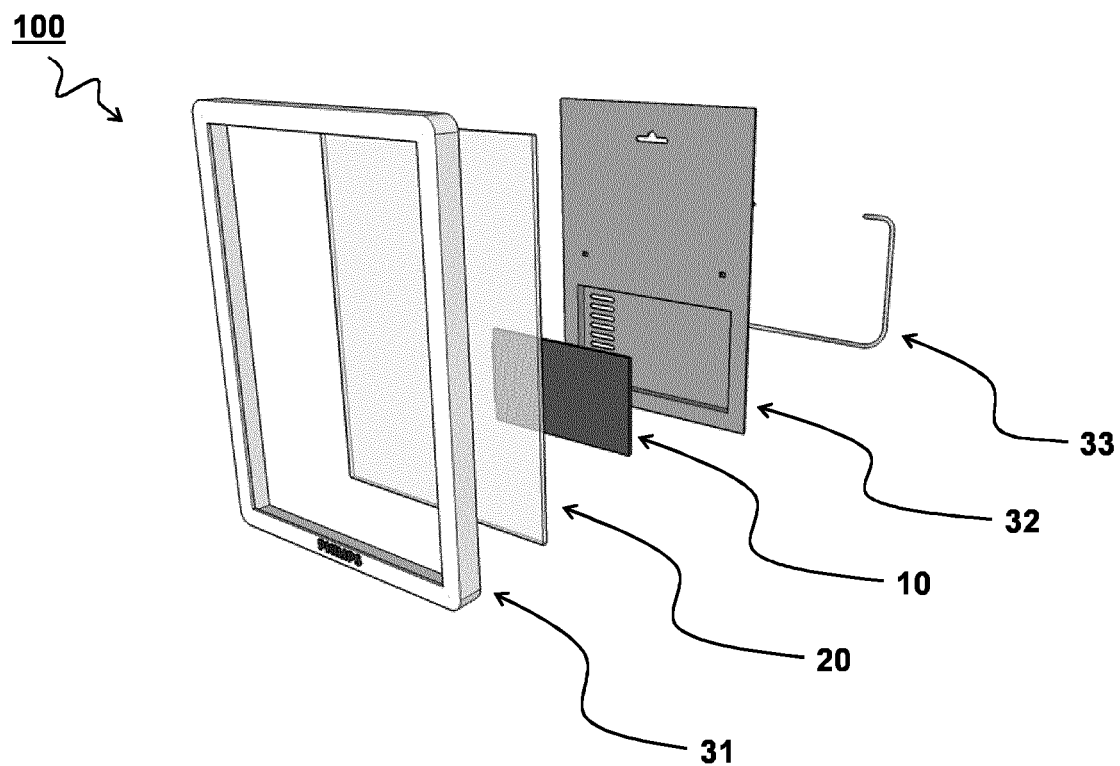
FIG. 4B schematically illustrates an exploded view of further components of a touchscreen mirror device according to the invention.

FIG. 4B schematically illustrates an exploded view of further components in a particular embodiment of a mirror device 100. For example, the mirror device 100 comprises a front bezel 31 and backplane 32 for holding the touchscreen panel 10 and the mirror surface 20 there between. For example, additional electrical circuitry can be provided in the backplane 32. The backplane 32 may optionally be equipped with a stand 33 to position the mirror device 100 on a table surface. Alternatively, or in addition, a means for hanging the mirror device 100 on the wall can be provided. In the embodiment shown, an area of the mirror surface 20 is larger than an area of the touchscreen panel 10. This may save cost wherein, for example, the touchscreen panel 10 comprises a conventional tablet core. Alternatively, also a larger panel 10 can be used, e.g. the same size as the mirror surface 20.

Figure 5A:
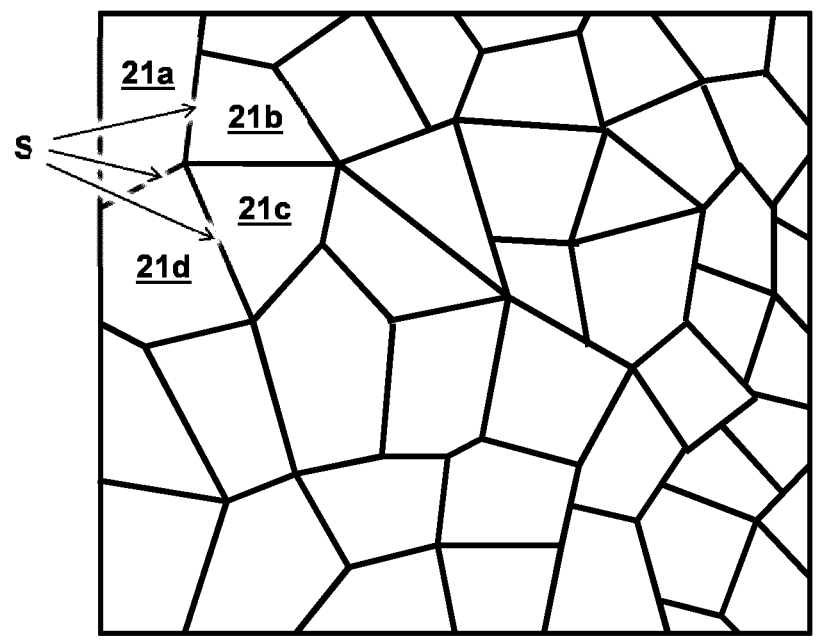
FIGS. 5A and 5B schematically illustrate patterns for dividing a metal layer of a mirror surface of the mirror device in separate metal islands.
Figure 5B:
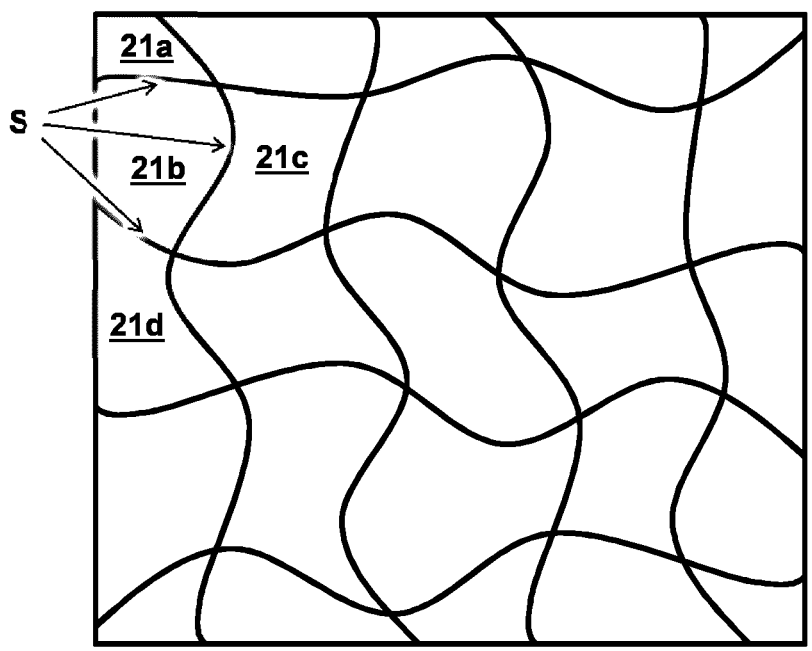

FIGS. 5A and 5B schematically illustrate examples of irregular patterns for dividing the metal layer of the mirror surface. In one embodiment, separation lines S between the metal islands 21a, 21b of the reflective metal layer 21 form an irregular pattern. For example, the irregular pattern comprises separation lines S between the metal islands that extend in three or more different directions. For example, the separation lines S have straight portions with a maximum length of less than five millimeters, preferably less than 2 millimeters. For example, the irregular pattern comprises curved lines. Also combinations are possible. Instead of an irregular pattern of metal islands, alternatively also a regular pattern having e.g. square or rectangular metal islands can be used. Such a regular pattern may have advantages with regard to manufacturability.

For the purpose of clarity and a concise description, features have been described herein as part of the same or separate embodiments, however, it will be appreciated that the scope of the invention may include embodiments having combinations of all or some of the features described. For example, while embodiments were shown for arrangements of mirror devices with a touchscreen panel, display, and mirror surface also alternative ways may be envisaged by those skilled in the art having the benefit of the present disclosure for achieving a similar function and result. For example, the display can be omitted, or provided by an external display source separate from the touchscreen mirror device. For example electrical components and structures may be combined or split up into one or more alternative components. The various elements of the embodiments as discussed and shown offer certain advantages, such as providing high quality reflective surfaces that are easy manufactured and allow capacitive sensing capability. Of course, it is to be appreciated that any one of the above embodiments or processes may be combined with one or more other embodiments or processes to provide even further improvements in finding and matching designs and advantages. It is appreciated that this disclosure offers particular advantages to beauty and smart personal care appliances, and in general can be applied for any application wherein sensor input through a reflective layer is desired.

In interpreting the appended claims, it should be understood that the word "comprising" does not exclude the presence of other elements or acts than those listed in a given claim; the word "a" or "an" preceding an element does not exclude the presence of a plurality of such elements; any reference signs in the claims do not limit their scope; several "means" may be represented by the same or different item(s) or implemented structure or function; any of the disclosed devices or portions thereof may be combined together or separated into further portions unless specifically stated otherwise.

What is claimed is:

1. A touchscreen mirror device comprising:
   a touchscreen panel having capacitive sensors defining a grid of sensor positions for detecting a position of an input object such as a fingertip across a surface of the mirror device; and
   a mirror surface covering the touchscreen panel at a front side thereof, facing a front side of the mirror device, and configured to at least partially reflect a mirror image at the front side of the mirror surface;
   wherein the mirror surface comprises a reflective metal layer divided in separate metal islands that are electrically isolated from each other; wherein respective capacitive sensors are associated with respective nearby metal islands, wherein the capacitive sensors are configured to measure a capacitive coupling with their associated metal islands;
   wherein at least a subset of the metal islands comprises pairs of neighboring metal islands having respective pairs of associated neighboring capacitive sensors, comprising a first capacitive sensor associated with a first metal island and a neighboring second capacitive sensor associated with a neighboring second metal island;
   wherein the neighboring metal islands are electrically isolated from each other by one contiguous non-conducting gap having a width between 10 and 200 micrometers without metal layer there between, wherein the touchscreen panel is configured to register a simultaneous coupling between the input object and two or more neighboring metal islands across the contiguous non-conducting gap by measuring a relative capacitive coupling between the respective two or more neighboring metal islands and their respective associated capacitive sensors at the respective sensor positions, wherein a positional mapping is calculated by at least one of interpolating and smoothing variable amounts of capacitive coupling measured across the grid of sensor positions.

2. The touchscreen mirror device according to claim 1, wherein the touchscreen panel is configured to provide a positional mapping of variable amounts of capacitive coupling as a function of position across the grid of sensor positions.

3. The touchscreen mirror device according to claim 1 wherein respective capacitive sensors are separated from their respective associated nearest metal islands by a distance between 0.05 and 5 millimeters, preferably between 0.1 and 3 millimeters.

4. The touchscreen mirror device according to claim 1, wherein the separate metal islands of the reflective metal layer are separated from each other by a gap having a width between 10 and 100 micrometers.

5. The touchscreen mirror device according to claim 1, wherein separation lines are present between the separate metal islands of the reflective metal layer, and wherein the separation lines form an irregular pattern, wherein the separation lines between the separate metal islands extend in three or more different directions and/or wherein the separation lines have a straight portion with a maximum length of less than five millimeters.

6. The touchscreen mirror device according to claim 1, wherein a maximum dimension of the separate metal islands in a direction parallel to the mirror surface is at most twelve millimeters.

7. The touchscreen mirror device according to claim 1, wherein the neighboring metal islands have dimensions that are comparable to or smaller than a separation between the neighboring capacitive sensors.

8. The touchscreen mirror device according to claim 1, comprising a controllable display for providing an illuminated display image, wherein the mirror surface is configured to at least partially transmit the illuminated display image from a back side of the mirror surface through the mirror surface to the front side of the mirror surface.

9. The touchscreen mirror device according to claim 8, wherein the display comprises pixels configured to form the display image.

10. The touchscreen mirror device according to claim 9, wherein the mirror device comprises a display controller configured to control the display image by controlling the pixels.

11. A method of manufacturing a touchscreen mirror device comprising:
   providing a touchscreen panel having capacitive sensors defining a grid of sensor positions for detecting a position of an input object such as a fingertip across a surface of the mirror device;
   covering the touchscreen panel at a front side thereof, facing a front side of the mirror device, with a mirror surface comprising a reflective metal layer configured to at least partially reflect a mirror image at a front side of the mirror surface; and
   dividing the reflective metal layer in separate metal islands that are electrically isolated from each other; wherein respective capacitive sensors are associated with respective nearby metal islands, wherein the capacitive sensors are configured to measure a capacitive coupling with their associated metal islands;
   wherein at least a subset of the metal islands comprises pairs of neighboring metal islands having respective pairs of associated neighboring capacitive sensors, comprising a first capacitive sensor associated with a first metal island and a neighboring second capacitive sensor associated with a neighboring second metal island;

wherein the neighboring metal islands are electrically isolated from each other by one contiguous non-conducting gap having a width between 10 and 200 micrometers without metal layer there between, wherein the touchscreen panel is configured to register a simultaneous coupling between the input object and two or more neighboring metal islands across the contiguous non-conducting gap by measuring a relative capacitive coupling between the respective two or more neighboring metal islands and their respective associated capacitive sensors at the respective sensor positions, wherein a positional mapping is calculated by at least one of interpolating and smoothing variable amounts of capacitive coupling measured across the grid of sensor positions.

12. The method according to claim 11, wherein the mirror surface is formed by providing the metal layer on a substrate and by etching gap lines into the metal layer to form the separate metal islands that are electrically isolated from each other.

13. The method according to claim 11, wherein a pattern of gap lines is etched into the metal layer using a mask pattern.

14. The method according to claim 11, comprising transmission of a first capacitive coupling between a finger and a plurality of the metal islands via a second capacitive coupling between the plurality of the metal islands and their respective associated capacitive sensors.

15. The method according to any of claim 14, comprising establishing a capacitive coupling between neighboring metal islands across the non-conductive gap there between.

* * * * *